(12) United States Patent
Iwasaki et al.

(10) Patent No.: US 9,698,103 B2
(45) Date of Patent: Jul. 4, 2017

(54) SEMICONDUCTOR DEVICE AND MANUFACTURING METHOD THEREFOR

(71) Applicant: TOYOTA JIDOSHA KABUSHIKI KAISHA, Toyota-shi, Aichi-ken (JP)

(72) Inventors: Shinya Iwasaki, Toyota (JP); Satoru Kameyama, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/947,274

(22) Filed: Nov. 20, 2015

(65) Prior Publication Data

US 2016/0163647 A1 Jun. 9, 2016

(30) Foreign Application Priority Data

Dec. 3, 2014 (JP) .................. 2014-244997

(51) Int. Cl.
*H01L 23/48* (2006.01)
*H01L 23/535* (2006.01)
(Continued)

(52) U.S. Cl.
CPC ...... *H01L 23/535* (2013.01); *H01L 21/76805* (2013.01); *H01L 21/76832* (2013.01); *H01L 21/76843* (2013.01); *H01L 21/76855* (2013.01); *H01L 21/76865* (2013.01); *H01L 21/76895* (2013.01); *H01L 23/485* (2013.01); *H01L 23/53266* (2013.01); *H01L 23/53295* (2013.01); *H01L 24/05* (2013.01); *H01L 23/3171* (2013.01); *H01L 2224/02166* (2013.01); *H01L 2224/05085* (2013.01); *H01L 2224/4847* (2013.01)

(58) Field of Classification Search
CPC ... H01L 23/595; H01L 23/3171; H01L 24/05; H01L 21/76805
USPC .................................. 257/751, 774
See application file for complete search history.

(56) References Cited

U.S. PATENT DOCUMENTS 6,853,081 B2 * 2/2005 Nakamura .......... H01L 23/5226 257/751
6,897,570 B2 * 5/2005 Nakajima .......... H01L 23/5226 257/773

(Continued)

FOREIGN PATENT DOCUMENTS

JP H0316145 A 1/1991
JP H056915 A 1/1993
(Continued)

*Primary Examiner* — Nitin Parekh
(74) *Attorney, Agent, or Firm* — Oliff PLC

(57) ABSTRACT

A semiconductor device comprises a conductive layer, a first insulating film, a barrier metal, a contact electrode, and a surface electrode. The first insulating film is located on the conductive layer and comprises a contact hole reaching the conductive layer. At least a surface part of the first insulating film is a BPSG film. The barrier metal covers an inner surface of the contact hole. The contact electrode is located in the contact hole and on the barrier metal. The surface electrode is located on the BPSG film and the contact electrode. The barrier metal is not interposed between the BPSG film and the surface electrode so that the surface electrode is directly in contact with the BPSG film. At least a part of the surface electrode is a bonding pad.

5 Claims, 18 Drawing Sheets

(51) Int. Cl.
*H01L 21/768* (2006.01)
*H01L 23/532* (2006.01)
*H01L 23/00* (2006.01)
*H01L 23/485* (2006.01)
*H01L 23/31* (2006.01)

(56) References Cited

U.S. PATENT DOCUMENTS

| | | | | |
|---|---|---|---|---|
| 6,998,712 | B2 * | 2/2006 | Okada | H01L 22/32 257/758 |
| 8,492,808 | B2 * | 7/2013 | Omori | H01L 27/228 257/295 |
| 2001/0051426 | A1 * | 12/2001 | Pozder | H01L 24/03 438/666 |
| 2003/0205811 | A1 * | 11/2003 | Nakamura | H01L 23/5226 257/751 |
| 2004/0016949 | A1 * | 1/2004 | Semi | H01L 24/03 257/300 |
| 2004/0222526 | A1 | 11/2004 | Wada et al. | |
| 2005/0127517 | A1 | 6/2005 | Ebihara | |
| 2009/0184424 | A1 * | 7/2009 | Furusawa | H01L 22/32 257/758 |
| 2010/0219502 | A1 * | 9/2010 | Shieh | H01L 23/5223 257/532 |
| 2013/0256783 | A1 | 10/2013 | Katou et al. | |
| 2015/0116968 | A1 * | 4/2015 | Yamada | H01L 24/32 361/767 |

FOREIGN PATENT DOCUMENTS

| | | |
|---|---|---|
| JP | H05347358 A | 12/1993 |
| JP | 2002-203812 A | 7/2002 |
| JP | 2004282034 A | 10/2004 |
| JP | 2005183407 A | 7/2005 |
| JP | 2013211374 A | 10/2013 |
| JP | 2014192351 A | 10/2014 |

* cited by examiner

SEMICONDUCTOR DEVICE AND MANUFACTURING METHOD THEREFOR

CROSS-REFERENCE TO RELATED APPLICATION

This application claims priority to Japanese Patent Application No. 2014-244997 filed on Dec. 3, 2014, the contents of which are hereby incorporated by reference into the present application.

TECHNICAL FIELD

A technique disclosed by the specification relates to a semiconductor device and a manufacturing method therefore.

DESCRIPTION OF RELATED ART

A semiconductor device in Japanese Patent Application Publication No. 2014-192351 A (referred to as Patent Document 1, hereinafter) has an insulating film provided on a surface of a semiconductor substrate. A contact hole is provided in the insulating film. An internal surface of the contact hole is covered with a barrier metal configured of Ti or the like. A contact electrode configured of Al or the like is disposed in the contact hole. In the contact hole, the contact electrode is connected to the semiconductor substrate via the barrier metal. The barrier metal prevents elements configuring the contact electrode from diffusing in the semiconductor substrate under the barrier metal. A surface electrode configured of Al or the like is disposed on the insulating film and contact electrode.

SUMMARY

In a semiconductor device in Patent Document 1, an entire surface of an insulating film is covered with a barrier metal, and a surface of the barrier metal is covered by a surface electrode. In the meanwhile, BPSG (Boron Phosphorus Silicon Glass) is known as a material for an insulating film. A BPSG film is one type of the insulating film and is a material of which surface is easy to flatten. In a case where the BPSG film is used as an insulating film in Patent Document 1, the BPSG film is in contact with a barrier metal. The barrier metal has low adhesion with the BPSG film. Therefore, in the case where the BPSG film is employed as an insulating film in Patent Document 1, the barrier metal is liable to be peeled off from the BPSG film Due to this, the surface electrode is liable to be peeled off from the BPSG film together with the barrier metal during wire bonding. Accordingly, this specification provides a semiconductor device employing a BPSG film as an insulating film and configured such that a surface electrode is rendered less liable to be peeled off.

A semiconductor device disclosed herein comprises a conductive layer, a first insulating film, a barrier metal, a contact electrode, and a surface electrode. The first insulating film is located on the conductive layer and comprises a contact hole reaching the conductive layer. At least a surface part of the first insulating film is a BPSG film. The barrier metal covers an inner surface of the contact hole. The contact electrode is located in the contact hole and on the barrier metal. The surface electrode is located on the BPSG film and the contact electrode. The barrier metal is not interposed between the BPSG film and the surface electrode so that the surface electrode is directly in contact with the BPSG film. At least a part of the surface electrode is a bonding pad.

The conductive layer in the foregoing is a layer having conductivity as high as or higher than a semiconductor. That is, the conductive layer is a conductor or semiconductor. That is, the conductive layer may be a semiconductor substrate or a wiring pattern provided on the surface of the semiconductor substrate.

In this semiconductor device, the internal surface of the contact hole is covered with the barrier metal, and the contact electrode is disposed on the barrier metal in the contact hole. Therefore, the barrier metal prevents elements forming the contact electrode from diffusing toward the conductive layer. Moreover, in the semiconductor device, the barrier metal is not interposed between the BPSG film and the surface electrode, but the surface electrode is in direct contact with the BPSG film. Accordingly, the surface electrode is less liable to be peeled off from the BPSG film. Therefore, peeling off of an electrode is unlikely to occur during wire bonding.

Further, a method for manufacturing a semiconductor device is herein provided. The method comprises a first insulating film forming process, a contact hole forming process, a barrier metal forming process, a contact electrode forming process, a contact electrode etching process, a barrier metal etching process, and a surface electrode forming process. In the first insulating film forming process, a first insulating film is formed on a conductive layer having a conductive property. At least a surface part of the first insulating film comprises a BPSG film. In the contact hole forming process, a contact hole reaching the conductive layer is formed in the first insulating film. In the barrier metal forming process, a barrier metal covering an inner surface of the contact hole and a surface of the BPSG film is formed. In the contact electrode forming process, a contact electrode is formed on the barrier metal. In the contact electrode etching process, the contact electrode is etched so that a part of the contact electrode outside the contact hole is removed and another part of the contact electrode remains in the contact hole. In the barrier metal etching process, the barrier metal is etched so that a part of the barrier metal on the surface of the BPSG film is removed. In the surface electrode forming process, a surface electrode is formed on the BPSG film and the contact electrode.

This method enables manufacturing of a semiconductor device in which a surface electrode and a BPSG film are in direct contact with each other. Accordingly, this method enables the manufacturing of a semiconductor device in which the surface electrode is less liable to be peeled away.

DESCRIPTION OF EMBODIMENTS

Embodiment 1

Figure 1:
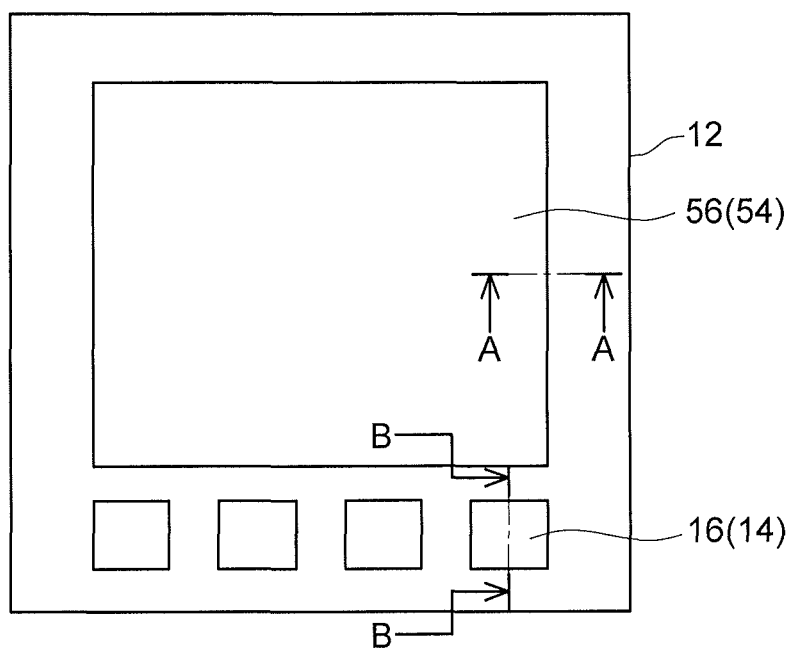
FIG. 1 is a plan view of a semiconductor device 10.

As shown in FIG. 1, a semiconductor device 10 according to Embodiment 1 has a semiconductor substrate 12. The semiconductor substrate 12 is configured of silicon. An emitter electrode 56 and a plurality of bonding pads 16 are provided on the upper surface of the semiconductor substrate 12. Hereinafter, vicinity of the emitter electrode 56 in the semiconductor device 10 is called a cell part 54. Additionally, vicinity of each bonding pad 16 in the semiconductor device 10 is called a pad part 14.

Figure 2:
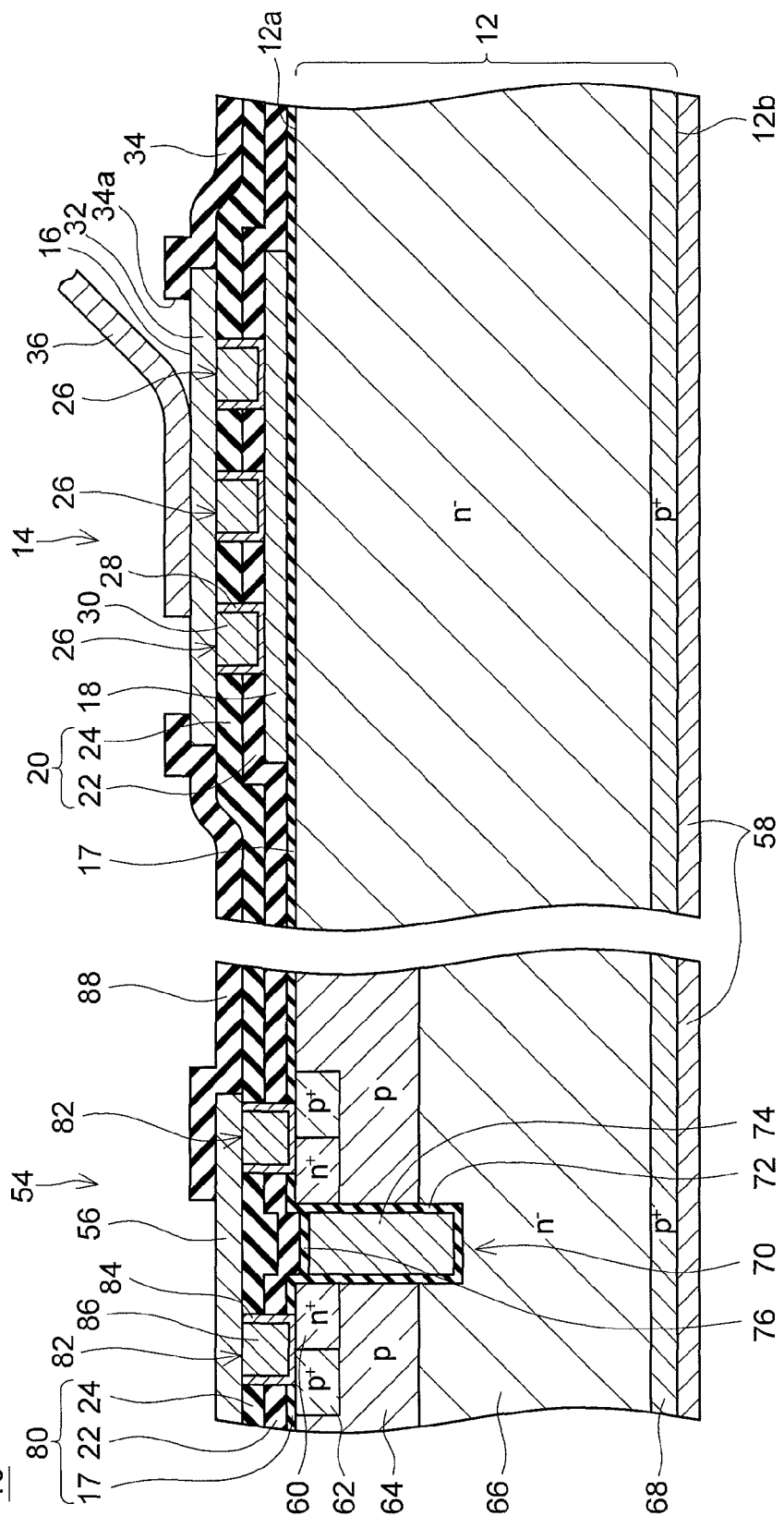
FIG. 2 shows vertical sections of the semiconductor device 10 taken along a line A-A and a line B-B, respectively, in FIG. 1.

FIG. 2 shows side-by-side respective vertical sections of the pad part 14 and cell part 54 of the semiconductor device 10. A collector electrode 58 is provided on the lower surface 12b of the semiconductor substrate 12. The collector electrode 58 extends across the pad part 14 and the cell part 54.

A surface oxide film 17 is provided on the upper surface 12a of the semiconductor substrate 12 in each pad part 14. The surface oxide film 17 is configured of $SiO_2$. The surface oxide film 17 covers an entire area of the upper surface 12a of semiconductor substrate 12 in the pad part 14. The surface oxide film 17 is obtained by oxidizing the semiconductor substrate 12.

A gate wiring 18 is provided on the surface oxide film 17. The gate wiring 18 is configured of polysilicon.

An insulating film 20 configured of $SiO_2$ is provided on the surface oxide film 17 and gate wiring 18. The insulating film 20 covers an upper surface of the gate wiring 18 and the upper surface of the surface oxide film 17 on which the gate wiring 18 is not provided. The insulating film 20 has an NSG film 22 and a BPSG film 24. The NSG film 22 is configured of NSG (Non-doped Silicon Glass). That is, the NSG film 22 is configured of $SiO_2$ in which boron and phosphorus are not doped. The NSG film 22 is provided on the surface oxide film 17 and gate wiring 18. The BPSG film 24 is configured of BPSG (Boron Phosphorus Silicon Glass). That is, the BPSG film 24 is configured of $SiO_2$ in which boron and phosphorus are doped. The BPSG film 24 is provided on the NSG film 22.

Figure 3:
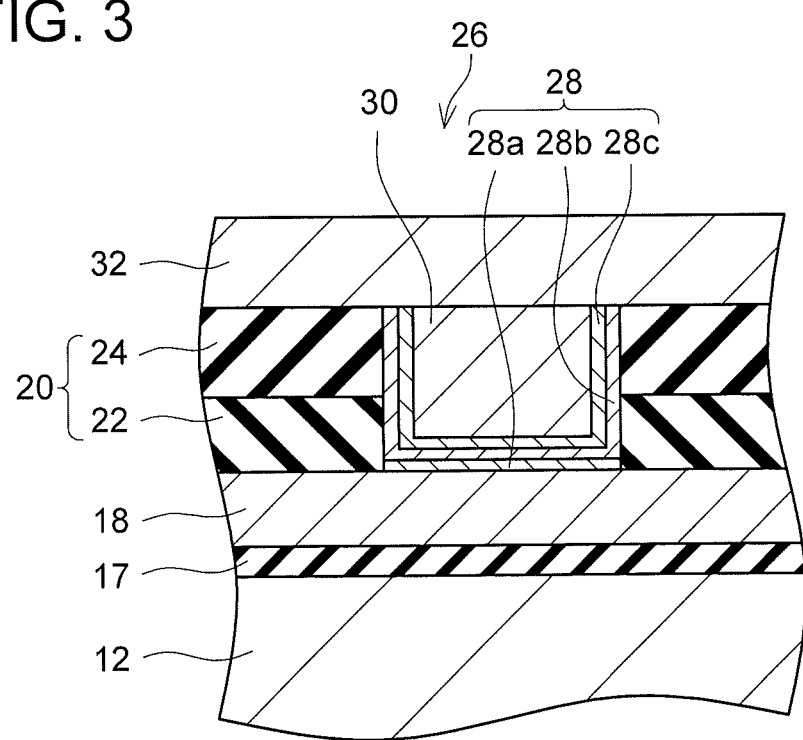
FIG. 3 is an enlarged sectional view of a contact hole 26.

A plurality of contact holes 26 are provided in the insulating film 20. Each contact hole 26 extends through the insulating film 20, from its upper surface to lower surface, provided within a range in which the gate wiring 18 is provided. A bottom of the contact hole 26 is configured of the gate wiring 18. An internal surface of the contact hole 26 (i.e., the upper surface of the gate wiring 18, serving as the bottom of the contact hole 26, and side faces of the insulating film 20) is covered with barrier metal 28. As shown in FIG. 3, the barrier metal 28 has a TiSi layer 28a, Ti layer 28b, and TiN layer 28c. The TiSi layer 28a is provided on the upper surface of the gate wiring 18. The TiSi layer 28a is in contact with the gate wiring 18 at low resistance. The Ti layer 28b covers a surface of the TiSi layer 28a and the side faces of the insulating film 20. The TiN layer 28c covers a surface of the Ti layer 28b. The barrier metal 28 is provided only in the contact hole 26 and is not provided on the upper surface of the insulating film 20.

Disposed in the contact hole 26 is a contact plug 30. The contact plug 30 is metal filled in the contact hole 26, and is configured of tungsten in the present embodiment. The contact plug 30 covers a surface of the barrier metal 28 (i.e., TiN layer 28c).

As shown in FIG. 2, a surface electrode 32 is provided on the surfaces of the insulating film 20 and contact plugs 30. The surface electrode 32 is configured of AlSi. The surface electrode 32 is connected to the gate wiring 18 via the contact plug 30 and barrier metal 28. Additionally, the barrier metal 28 is not interposed between the surface electrode 32 and the BPSG film 24. That is, the surface electrode 32 is in direct contact with the BPSG film 24.

A protective film 34 is provided on the insulating film 20 in a range where no surface electrode 32 is provided. The protective film 34 is an insulating film. The protective film 34 is configured of a polyimide film, SiN film, or a laminate film in which the polyimide film is arranged on the SiN film in layers. An opening 34a is provided in the protective film 34. The surface electrode 32 is exposed in the opening 34a. The protective film 34 also covers ends of the surface electrode 32. A surface of the surface electrode 32 in the opening 34a is a bonding pad 16. The bonding pad 16 is provided so as to partially include at least the surface electrode 32 on the BPSG film 24. A wire 36 configured of Al is bonded to the bonding pad 16. The other end of the wire 36 is connected to an electrode (not shown).

In the cell part 54, an IGBT is provided. The IGBT has a structure described below. An emitter region 60, a body contact region 62, a body region 64, a drift region 66, and a collector region 68 are provided in the semiconductor substrate 12 in the cell part 54. The emitter region 60 is of n-type and provided in a position facing the upper surface 12a of the semiconductor substrate 12. The body contact region 62 is a $p^+$-type and provided in a position facing the upper surface 12a of the semiconductor substrate 12. The body region 64 is of $p^-$-type and provided under the emitter region 60 and body contact region 62. A P-type impurity concentration in the body region 64 is lower than a p-type impurity concentration in the body contact region 62. The drift region 66 is of n-type and provided under the body region 64. The drift region 66 is also provided in the semiconductor substrate 12 of each pad part 14. The collector region 68 is of p-type and provided under the drift region 66. The collector region 68 is also provided in the semiconductor substrate 12 of each pad part 14. The collector region 68 is provided in a position facing the lower surface 12b of the semiconductor substrate 12. The collector region 68 is connected to the collector electrode 58.

Trenches 70 (only one trench 70 is shown in FIG. 2) are provided on the upper surface 12a of the semiconductor substrate 12 in the cell part 54. Each of the trenches 70 penetrates the emitter region 60 and body region 64 so as to reach the drift region 66. An internal surface of each trench 70 is covered with a gate insulating film 72. A gate electrode 74 is provided in each trench 70. Each gate electrode 74 is insulated from the semiconductor substrate 12 by the respective gate insulating film 72. Each gate electrode 74 faces the emitter region 60, body region 64, and drift region 66 via the respective gate insulating film 72. Each gate electrode 74 is connected to the above-described gate wiring 18 in a place not shown. Each gate electrode 74 is electrically connected to the surface electrode 32 (that is, the wire 36) via the gate wiring 18. An upper surface of each gate electrode 74 is covered with a cap insulating film 76.

An upper surface 12a of the semiconductor substrate 12 in the cell part 54 is covered with an insulating film 80 configured of $SiO_2$. The insulating film 80 is configured of the aforementioned surface oxide film 17, NSG film 22, and BPSG film 24. That is, in each cell part 54, the surface oxide film 17, NSG film 22, and BPSG film 24 are arranged in layers on the upper surface 12a of the semiconductor substrate 12, and they collectively form the insulating film 80.

A plurality of contact holes 82 is provided in the insulating film 80. Each contact hole 82 extends through the insulating film 80, from its upper surface to lower surface. A bottom of the contact hole 82 is configured by the upper surface 12a of the semiconductor substrate 12. The emitter region 60 and body contact region 62 face the bottom of the contact hole 82. An internal surface of the contact hole 82 (i.e., the upper surface 12a of the semiconductor substrate 12, serving as the bottom of the contact hole 82, and side faces of the insulating film 80) is covered with a barrier metal 84. The barrier metal 84 has a laminate structure of a TiSi layer, Ti layer, and TiN layer, as with the barrier metal 28 described above. The barrier metal 84 is provided only in the contact hole 82 and is not provided on an upper surface of the insulating film 80.

A contact plug 86 is disposed in each contact hole 82. The contact plug 86 is a metal filled in the contact hole 82, and is configured of tungsten in the present embodiment. The contact plug 86 covers a surface of the barrier metal 84.

An emitter electrode 56 is provided on the surfaces of the insulating film 80 and contact plugs 86. The emitter electrode 56 is configured of AlSi. The emitter electrode 56 is connected to the emitter region 60 and body contact region 62 via the contact plug 86 and barrier metal 84. Additionally, the barrier metal 84 is not interposed between the emitter electrode 56 and the BPSG film 24. That is, the emitter electrode 56 is in direct contact with the BPSG film 24.

A polyimide film 88 is provided on the insulating film 80 in a range where the emitter electrode 56 is not provided. The polyimide film 88 is an insulating film. The polyimide film 88 also covers an end of the emitter electrode 56. Although not shown, the emitter electrode 56, in the range where this electrode 56 is not covered with the polyimide film 88, is connected to an external electrode by means of solder.

Figure 4:
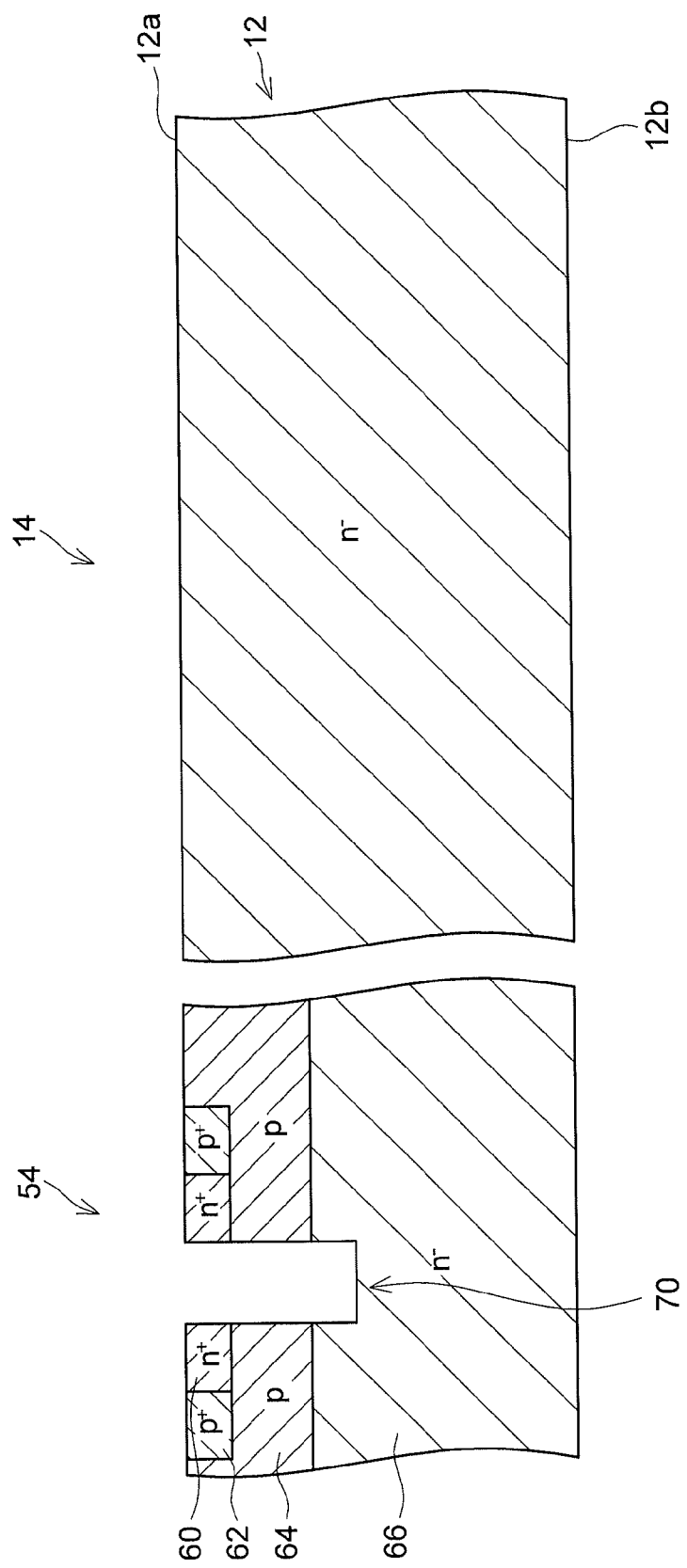
FIG. 4 is an explanatory view for a manufacturing process for the semiconductor device 10.

Next, a manufacturing method for the semiconductor device 10 will be described. The semiconductor device 10 is manufactured from an n-type semiconductor substrate 12 with a same n-type impurity concentration as a drift region 66. As shown in FIG. 4, an emitter region 60, body contact region 62, and body region 64 are first formed in the semiconductor substrate 12 by ion implantation. Next, a trench 70 is formed by anisotropic etching.

Figure 5:
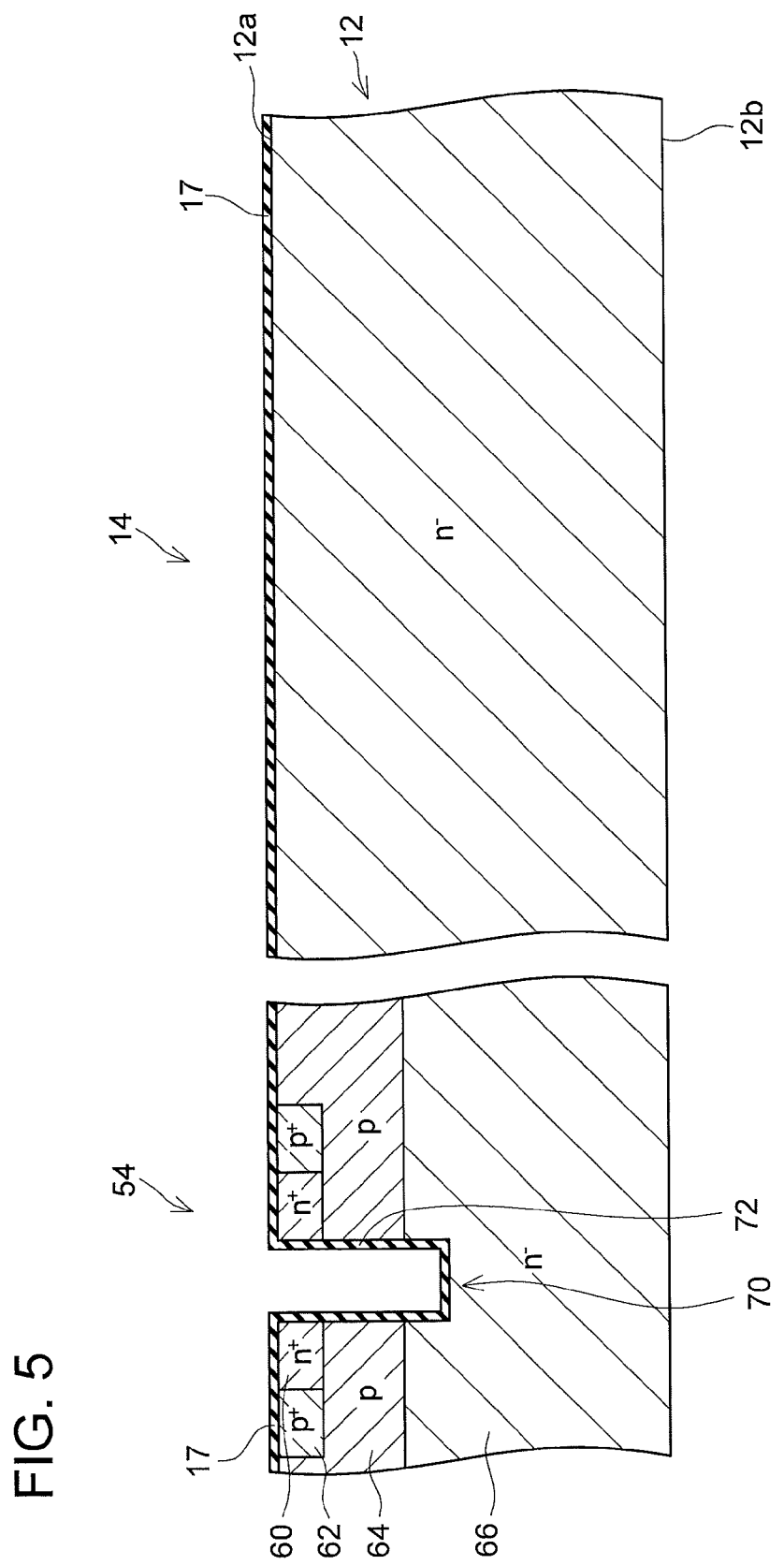
FIG. 5 is an explanatory view for the manufacturing process for the semiconductor device 10.

Next, as shown in FIG. 5, a surface of the semiconductor substrate 12 is oxidized, thereby simultaneously forming a gate insulation film 72 and surface oxide film 17.

Figure 6:
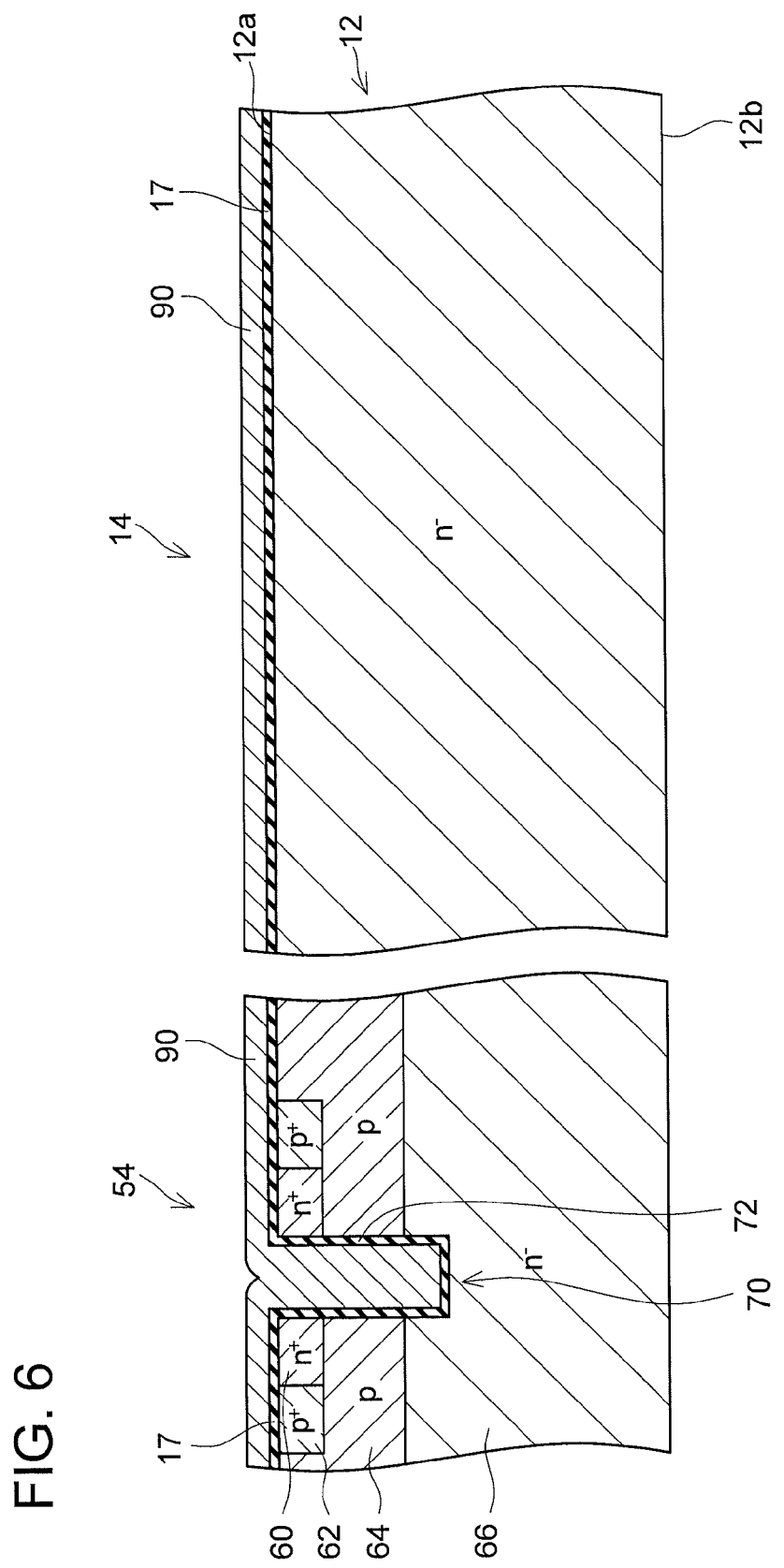
FIG. 6 is an explanatory view for the manufacturing process for the semiconductor device 10.
Figure 7:
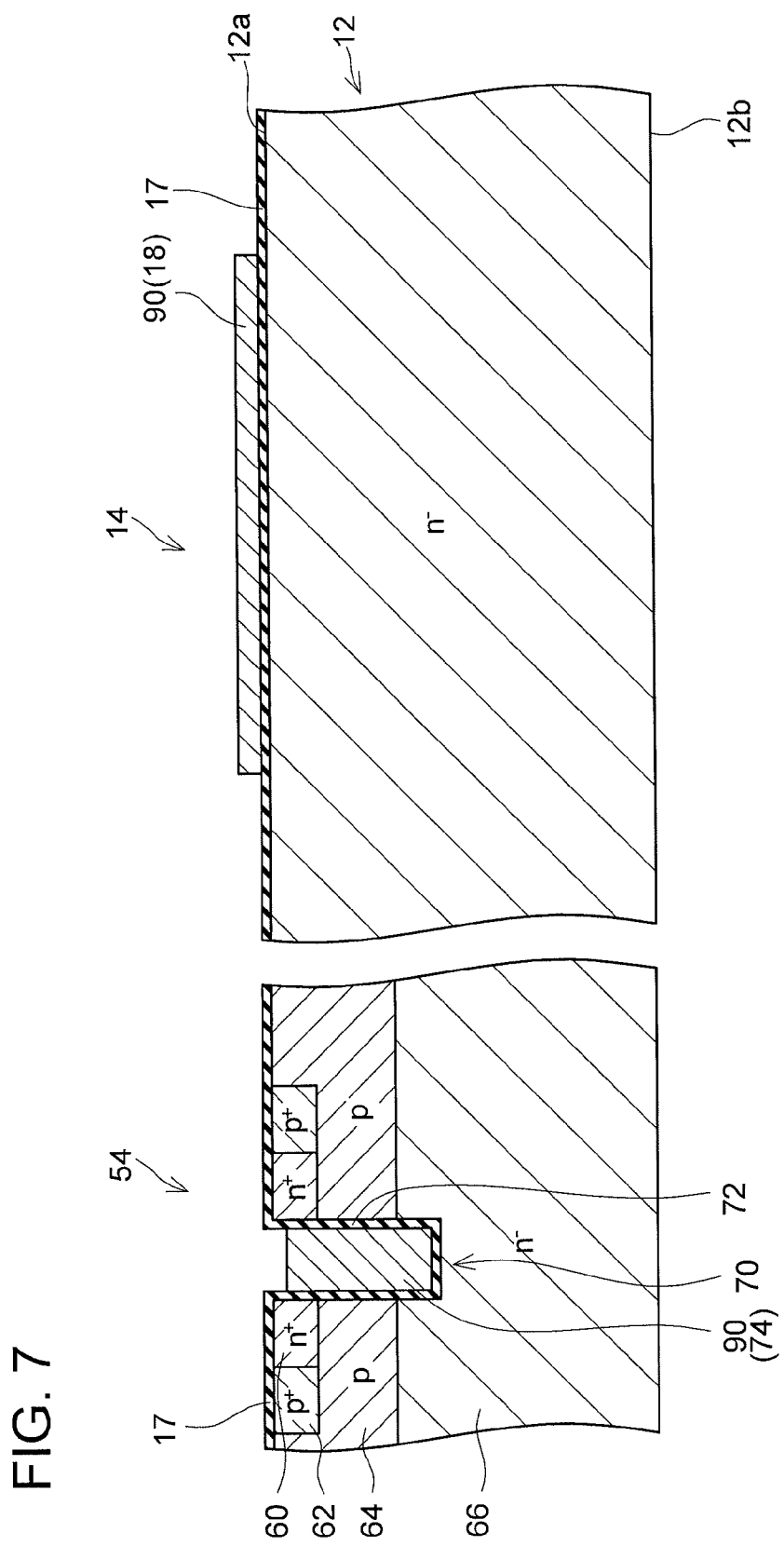
FIG. 7 is an explanatory view for the manufacturing process for the semiconductor device 10.

Next, as shown in FIG. 6, a polysilicon layer 90 is allowed to develop on the semiconductor substrate 12. Next, the polysilicon layer 90 is selectively etched. Here, as shown in FIG. 7, the polysilicon layer 90 is allowed to remain in the trench 70. The polysilicon layer 90 remaining in the trench 70 is a gate electrode 74. Additionally, as shown in FIG. 7, the polysilicon layer 90 is allowed to partially remain on the surface oxide film 17 in a pad part 14. The polysilicon layer 90 remaining on the surface oxide film 17 is a gate wiring 18. Next, as shown in FIG. 8, a cap insulating film 76 is formed on an upper surface of the gate electrode 74.

Figure 8:
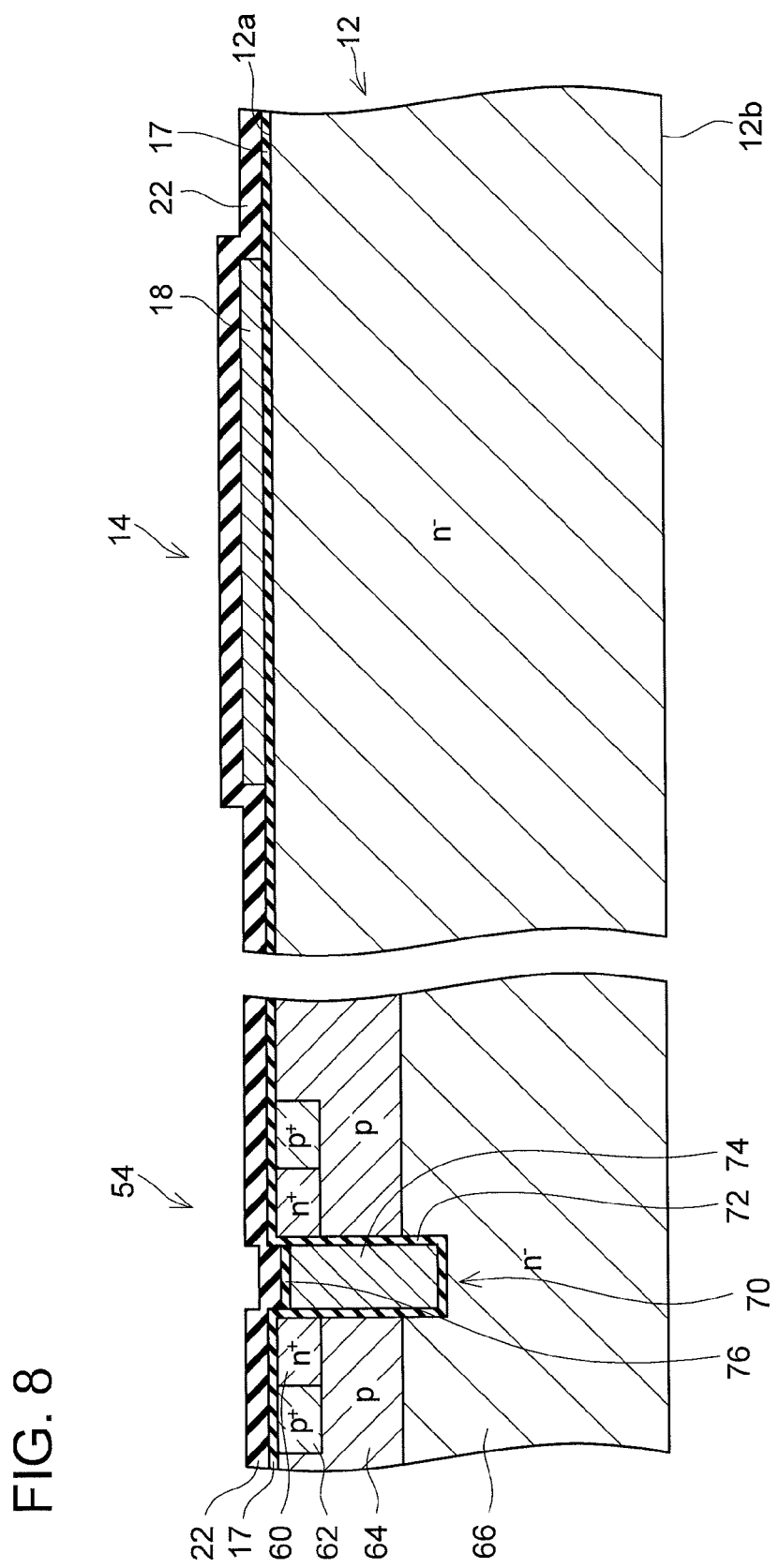
FIG. 8 is an explanatory view for the manufacturing process for the semiconductor device 10.
Figure 9:
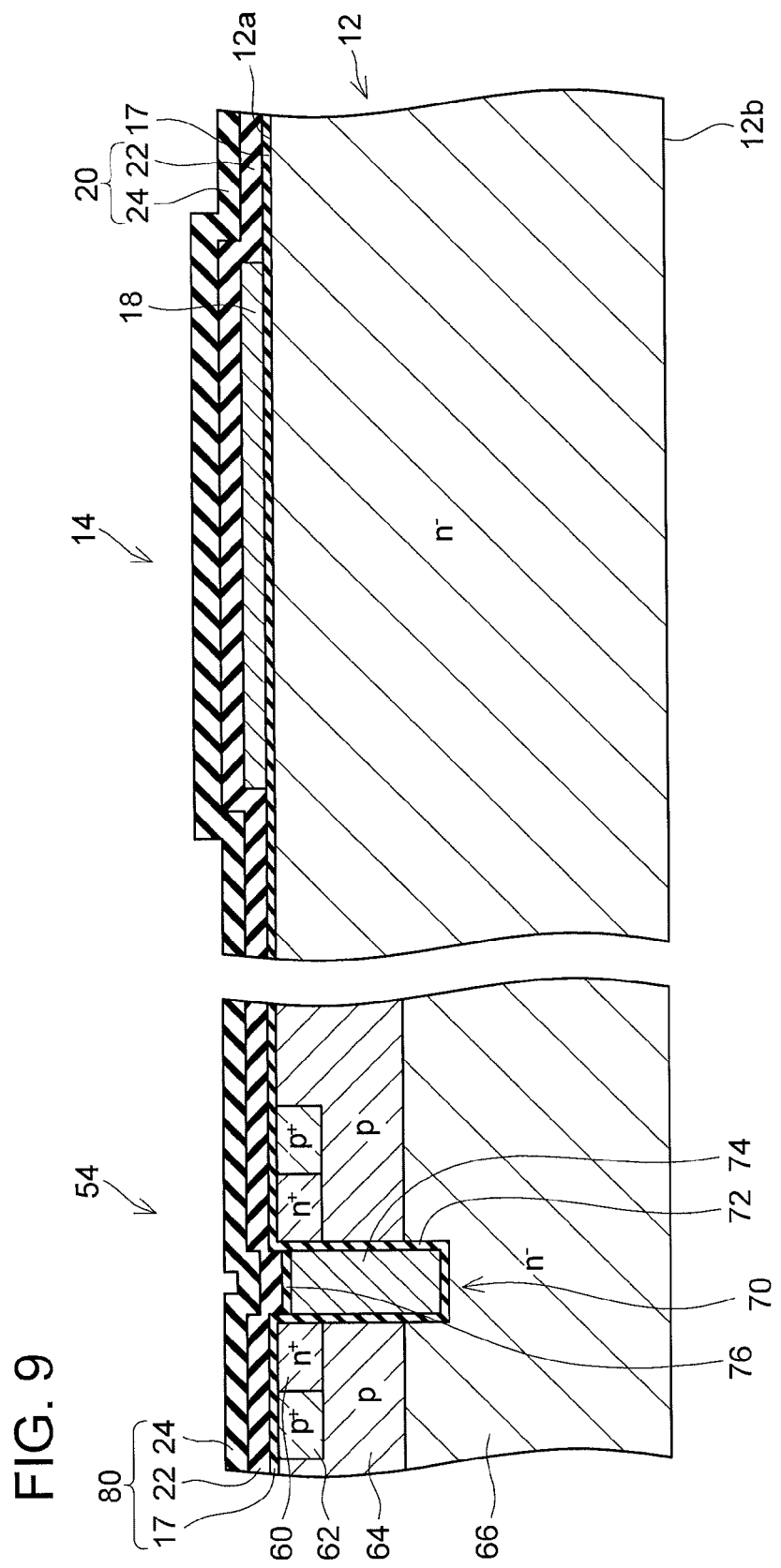
FIG. 9 is an explanatory view for the manufacturing process for the semiconductor device 10.

Subsequently, as shown in FIG. 8, an NSG film 22 is allowed to develop on the semiconductor substrate 12 by CVD. The surface oxide film 17 and gate wiring 18 are covered with the NSG film 22. Subsequently, as shown in FIG. 9, a BPSG film 24 is allowed to develop on the NSG film 22 by CVD. The formation of the BPSG film 24 completes an insulating film 20 in the pad part 14 and an insulating film 80 in the cell part 54. In the formation of the BPSG film 24, the NSG film 22 prevents boron and phosphorus in the BPSG film 24 from diffusing in the semiconductor substrate 12. Thus, forming of the NSG film 22 first and the BPSG film 24 next can prevent the diffusion of boron and phosphorus from the BPSG film 24 into the semiconductor substrate 12.

Figure 10:
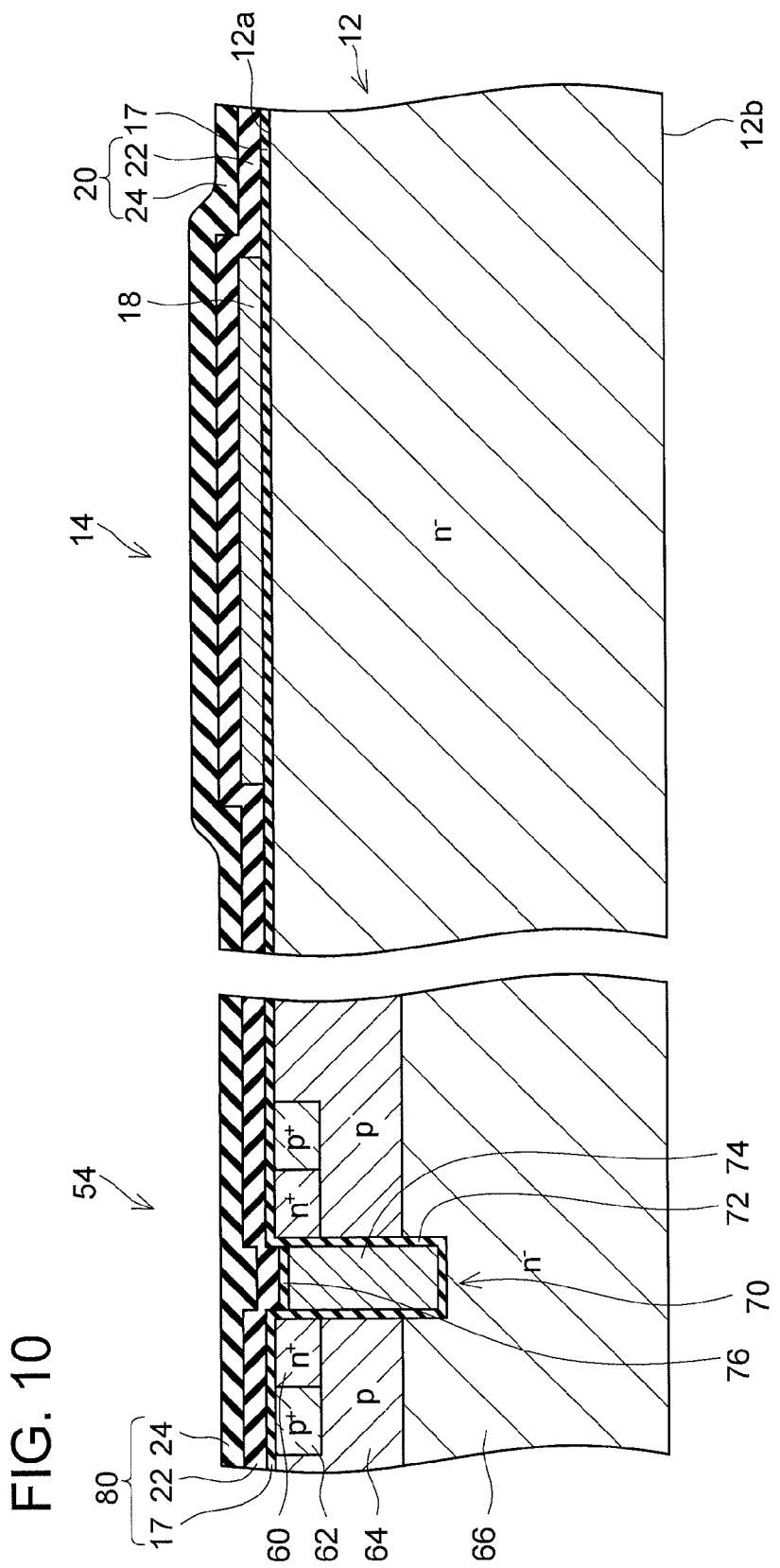
FIG. 10 is an explanatory view for the manufacturing process for the semiconductor device 10.

Next, the semiconductor substrate 12 is heat treated. During the heat treatment, the BPSG film 24 flows, so that a surface of the BPSG film 24 is flattened. Therefore, as shown in FIG. 10, the surface of the BPSG film 24 after the heat treatment is flatter than that before the heat treatment.

Figure 11:
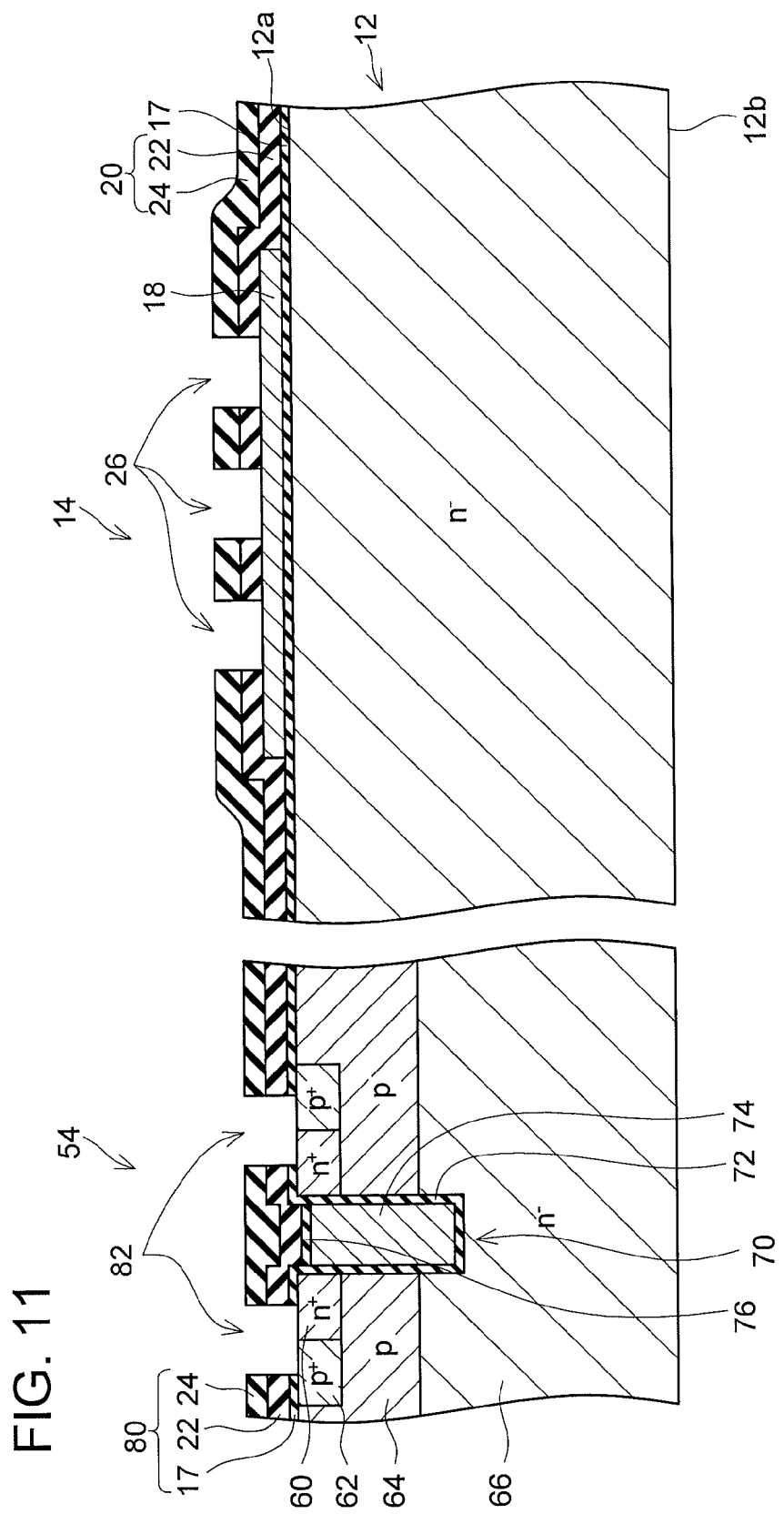
FIG. 11 is an explanatory view for the manufacturing process for the semiconductor device 10.

Next, by selectively etching the insulating films 20, 80, contact holes 26, 82 are formed as shown in FIG. 11.

Figure 12:
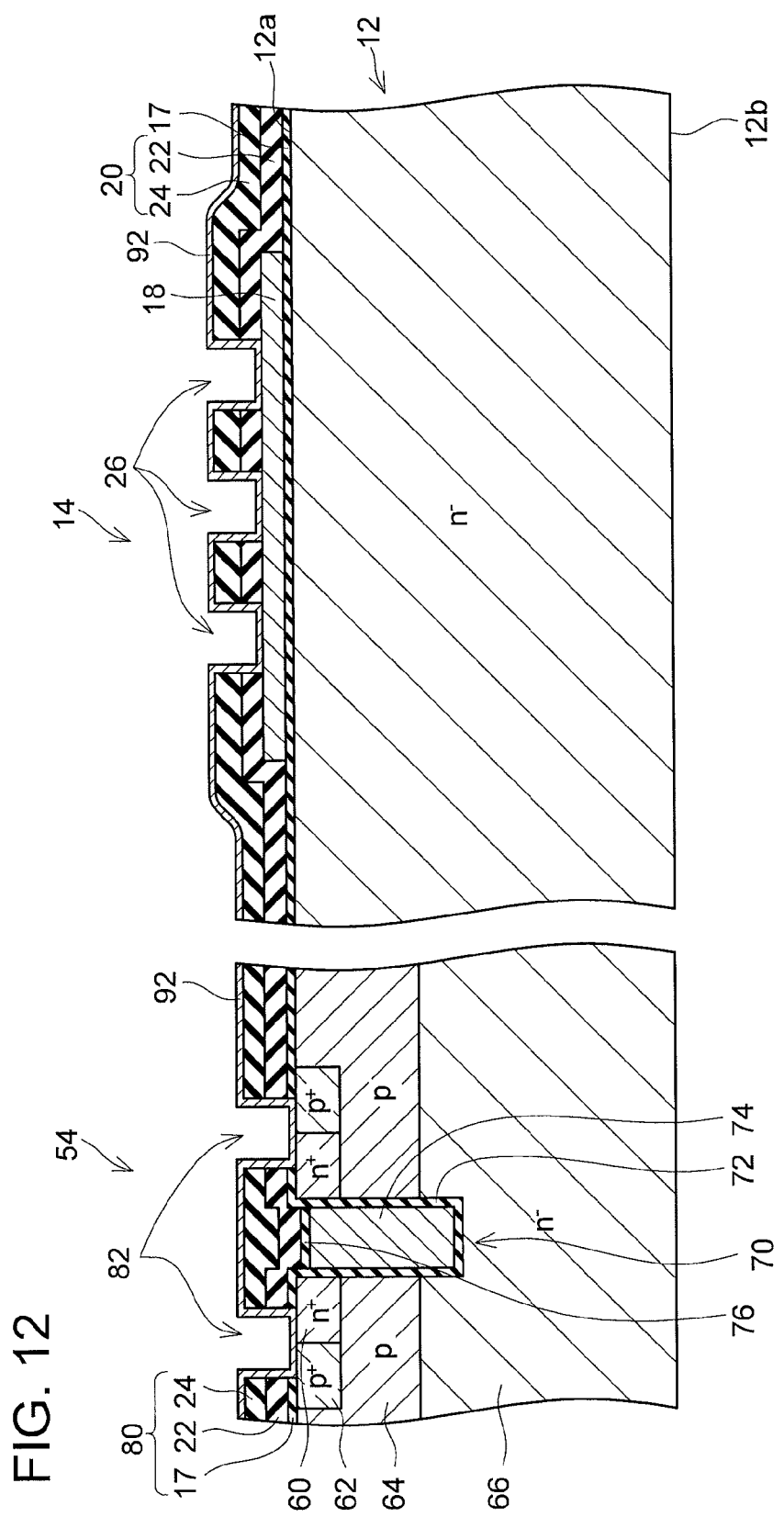
FIG. 12 is an explanatory view for the manufacturing process for the semiconductor device 10.

Subsequently, as shown in FIG. 12, a barrier metal layer 92 is formed on a surface of the semiconductor substrate 12. The barrier metal layer 92 is formed so as to cover respective internal surfaces of the contact holes 26, 82 and an upper surface of the BPSG film 24. More specifically, the barrier metal layer 92 is formed as described below. First, a Ti layer (i.e., the Ti layer 28b in FIG. 3) is formed on a surface of the semiconductor substrate 12. Meanwhile, on a bottom of the contact hole 26, Ti of the Ti layer and silicon of the gate wiring 18 become alloyed, thereby forming a TiSi layer (i.e., the TiSi layer 28a in FIG. 3). The TiSi layer 28a is connected to the gate wiring 18 at low resistance. Additionally, on the bottom of each contact hole 82, Ti of the Ti layer and silicon of the semiconductor substrate 12 become alloyed, thereby forming a TiSi layer. This TiSi layer is connected to the semiconductor substrate 12 at low resistance. Next, a TiN layer (i.e., the TiN layer 28c in FIG. 3) is formed. Thus, the barrier metal layer 92 shown in FIG. 12 is obtained.

Figure 13:
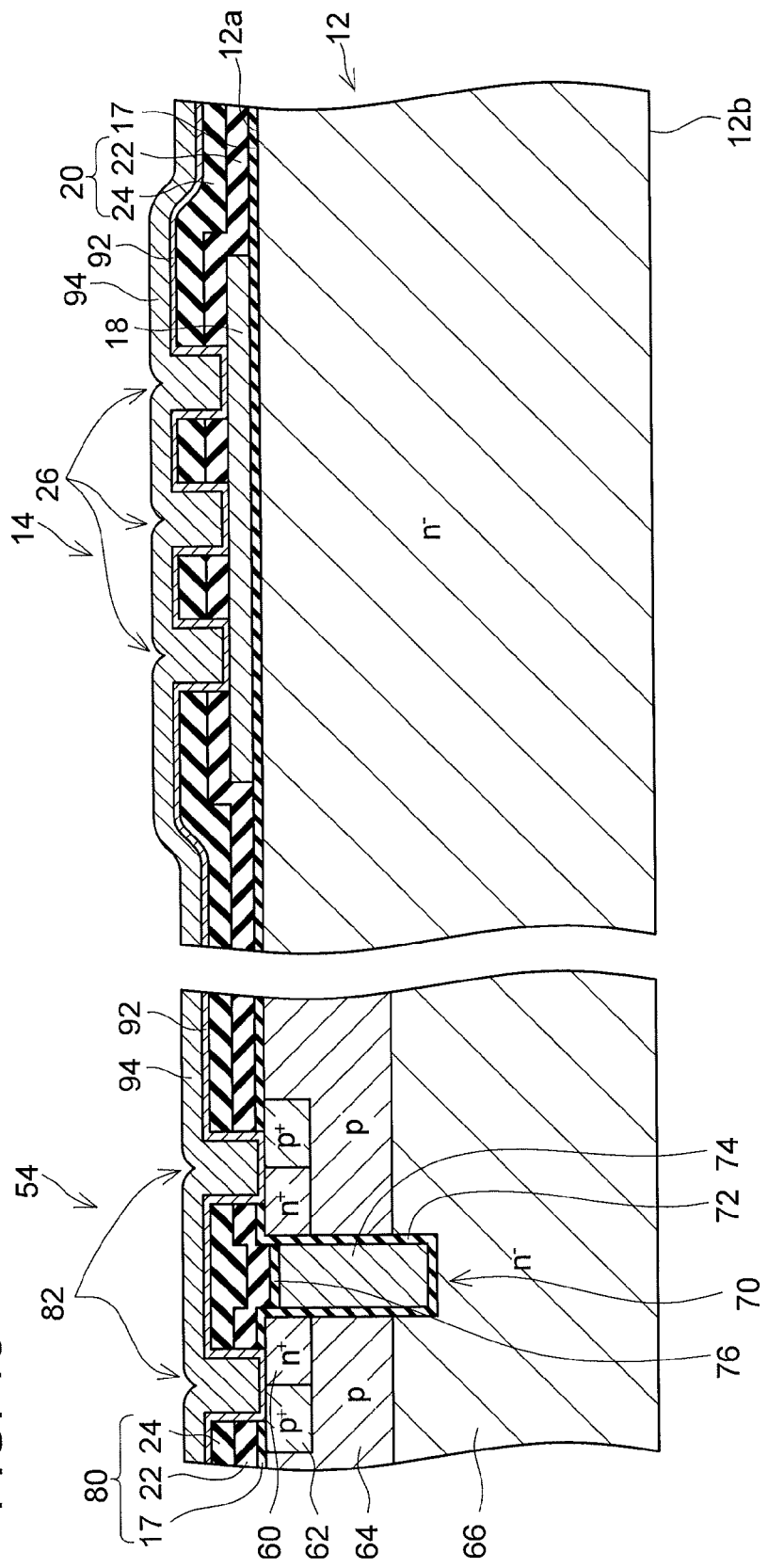
FIG. 13 is an explanatory view for the manufacturing process for the semiconductor device 10.

Next, tungsten is allowed to develop on the surface of the semiconductor substrate 12. Thereby, a contact plug layer 94 is formed as shown in FIG. 13. The tungsten develops to fill each of the contact holes 26, 82. Therefore, the contact plug layer 94 fills the contact holes 26, 82 without any gap. Additionally, the contact plug layer 94 is also formed on the barrier metal layer 92 located on the insulating films 20, 80. When the contact plug layer 94 is formed, the barrier metal layer 92 (particularly, the TiN layer) prevents tungsten configuring the contact plug layer 94 from diffusing toward the semiconductor substrate 12. Thus, formation of, for example, a defect in a contact part of the semiconductor substrate 12 is prevented. Additionally, the barrier metal layer 92 prevents the tungsten from diffusing into the gate wiring 18 from the contact plug layer 94.

Figure 14:
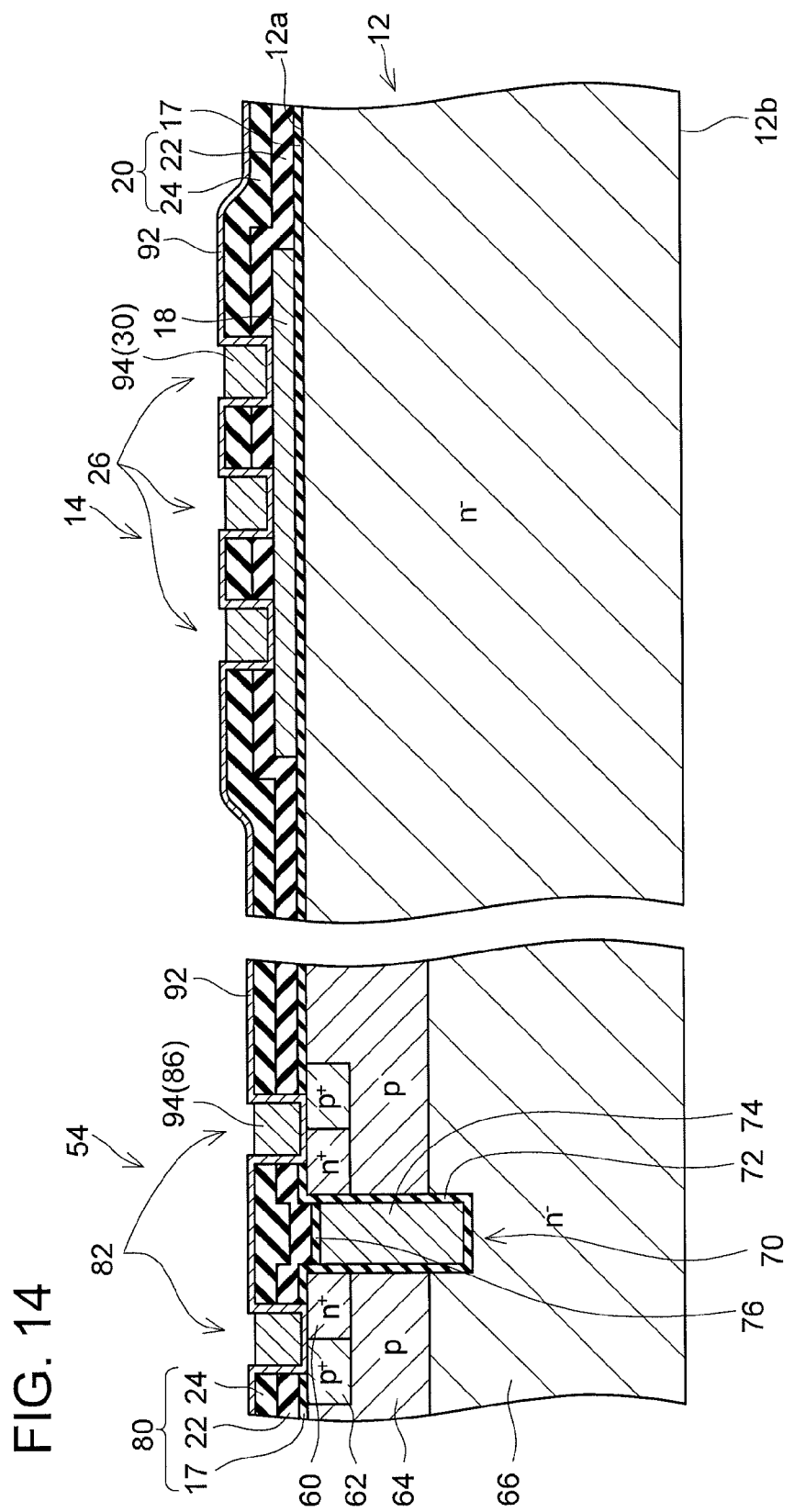
FIG. 14 is an explanatory view for the manufacturing process for the semiconductor device 10.

Next, by etching the contact plug layer 94, a part of the contact plug layer 94 that is located on tops of the insulating films 20, 80 is removed as shown in FIG. 14. Thus, the barrier metal layer 92 on the insulating films 20, 80 is exposed. Additionally, another part of the contact plug layer 94 is allowed to remain in the contact holes 26, 82. The part of the contact plug layer 94 remaining in each contact hole 26 is a contact plug 30. The part of the contact plug layer 94 remaining in each contact hole 82 is a contact plug 86.

Figure 15:
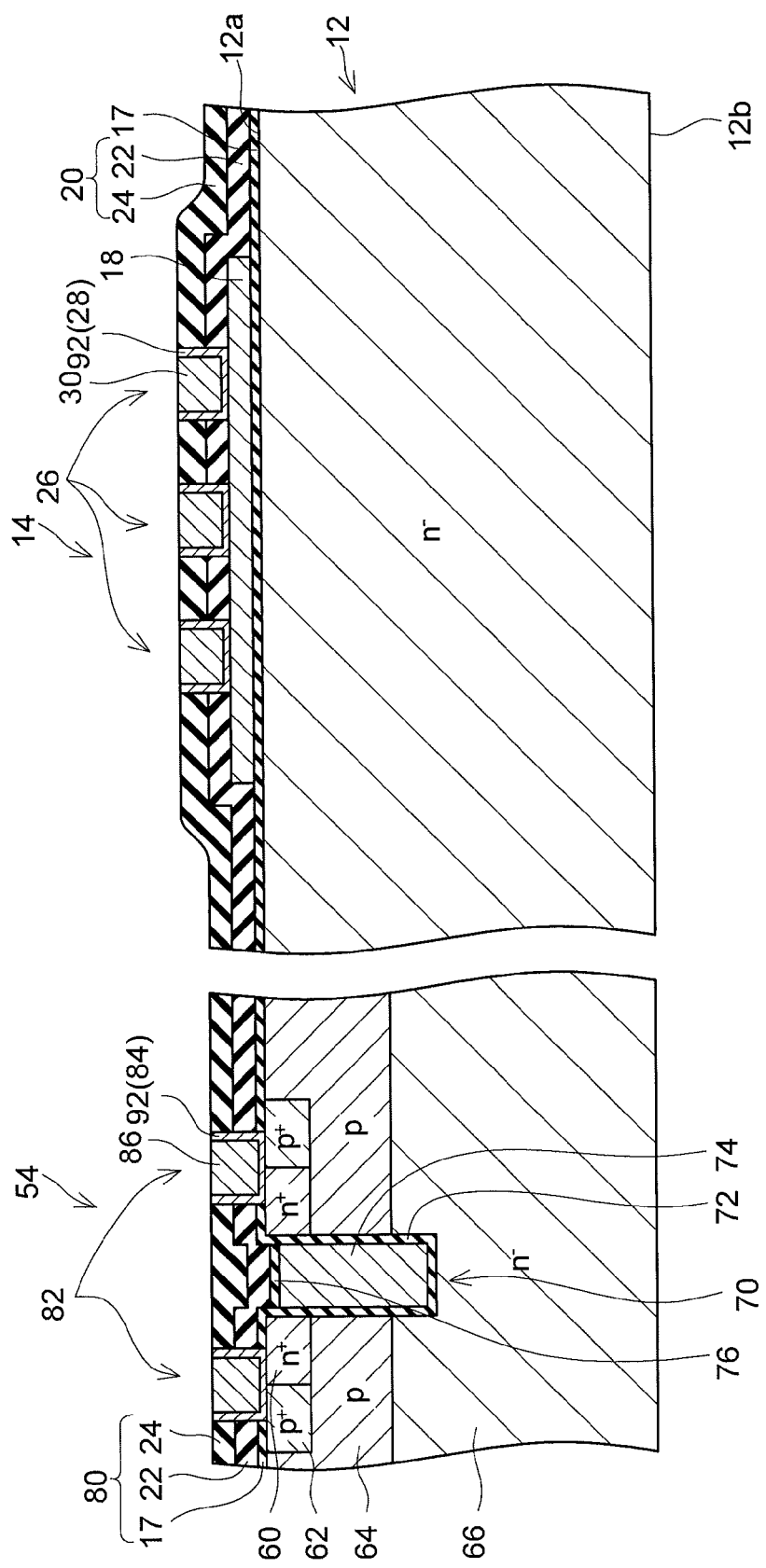
FIG. 15 is an explanatory view for the manufacturing process for the semiconductor device 10.

Next, by etching the barrier metal layer 92, a part of the barrier metal layer 92 that is on the insulating films 20, 80 is removed as shown in FIG. 15. Thus, the upper surface of the BPSG film 24 is exposed. Since a part of the barrier metal layer 92 in the contact holes 26, 82 is covered with the contact plugs 30, 86, and is thus not etched. Consequently, the part of the barrier metal layer 92 remains in the contact holes 26, 82. The part of the barrier metal layer 92 remaining in each contact hole 26 is a barrier metal 28. The part of the barrier metal layer 92 remaining in each contact hole 82 is a barrier metal 84.

Figure 16:
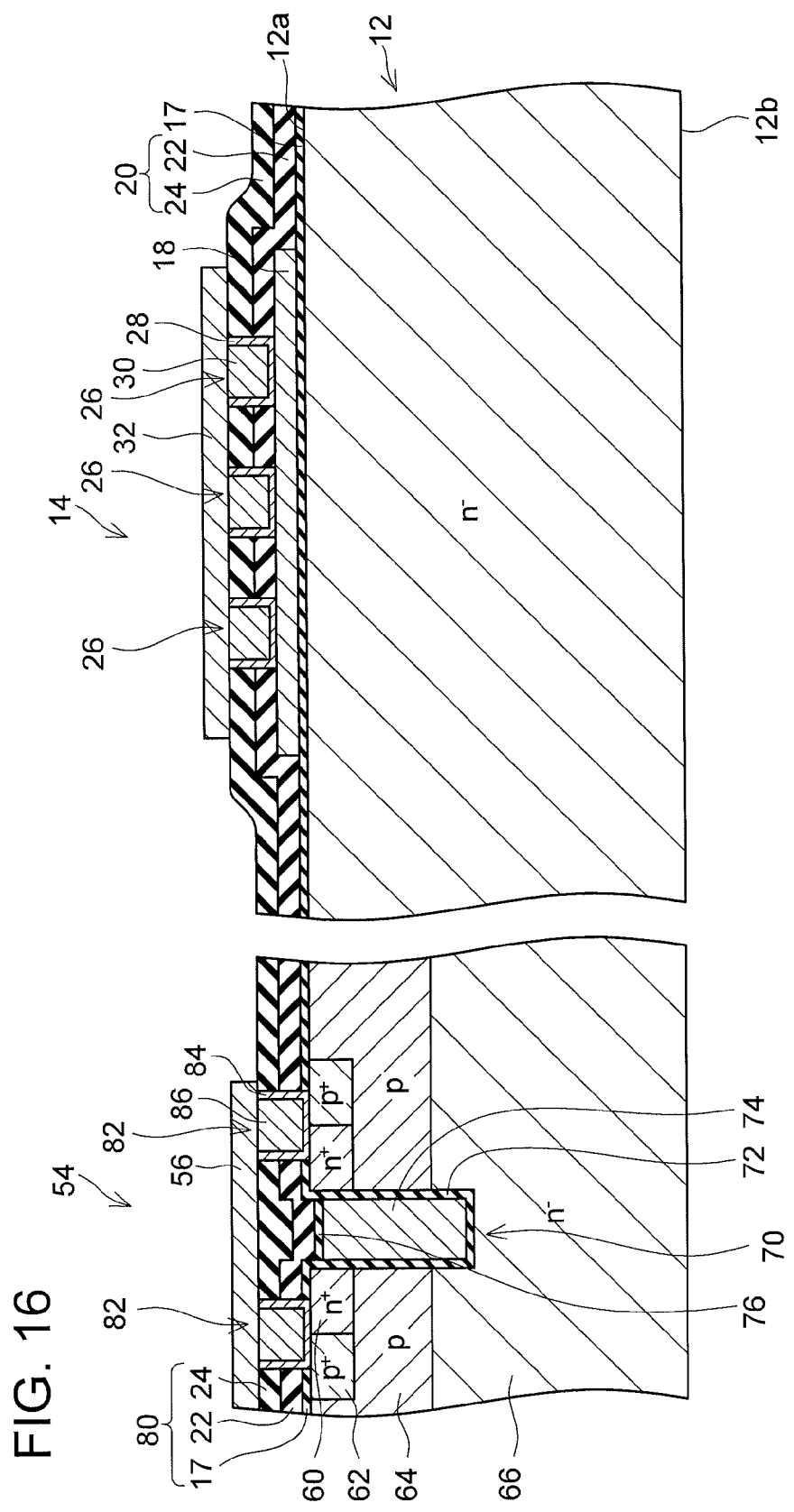
FIG. 16 is an explanatory view for the manufacturing process for the semiconductor device 10.

Next, an AlSi layer is formed on the surface of the semiconductor substrate 12, and then the AlSi layer is patterned. Thereby, a surface electrode 32 and an emitter electrode 56 are formed as shown in FIG. 16. The surface electrode 32 is formed so as to cover the contact plugs 30 and BPSG film 24. Since the BPSG film 24 is exposed, the surface electrode 32 is in direct contact with the BPSG film 24. The barrier metal 28 (i.e., a metal layer containing Ti) is not formed between the surface electrode 32 and the BPSG film 24, the surface electrode 32 is in close contact with the BPSG film 24 highly strongly. The emitter electrode 56 is formed so as to cover the contact plugs 86 and BPSG film 24. Since the BPSG film 24 is exposed, the emitter electrode 56 is in direct contact with the BPSG film 24. The barrier metal 84 (i.e., a metal layer containing Ti) is not formed between the emitter electrode 56 and the BPSG film 24, the emitter electrode 56 is in close contact with the BPSG film 24 highly strongly.

Figure 17:
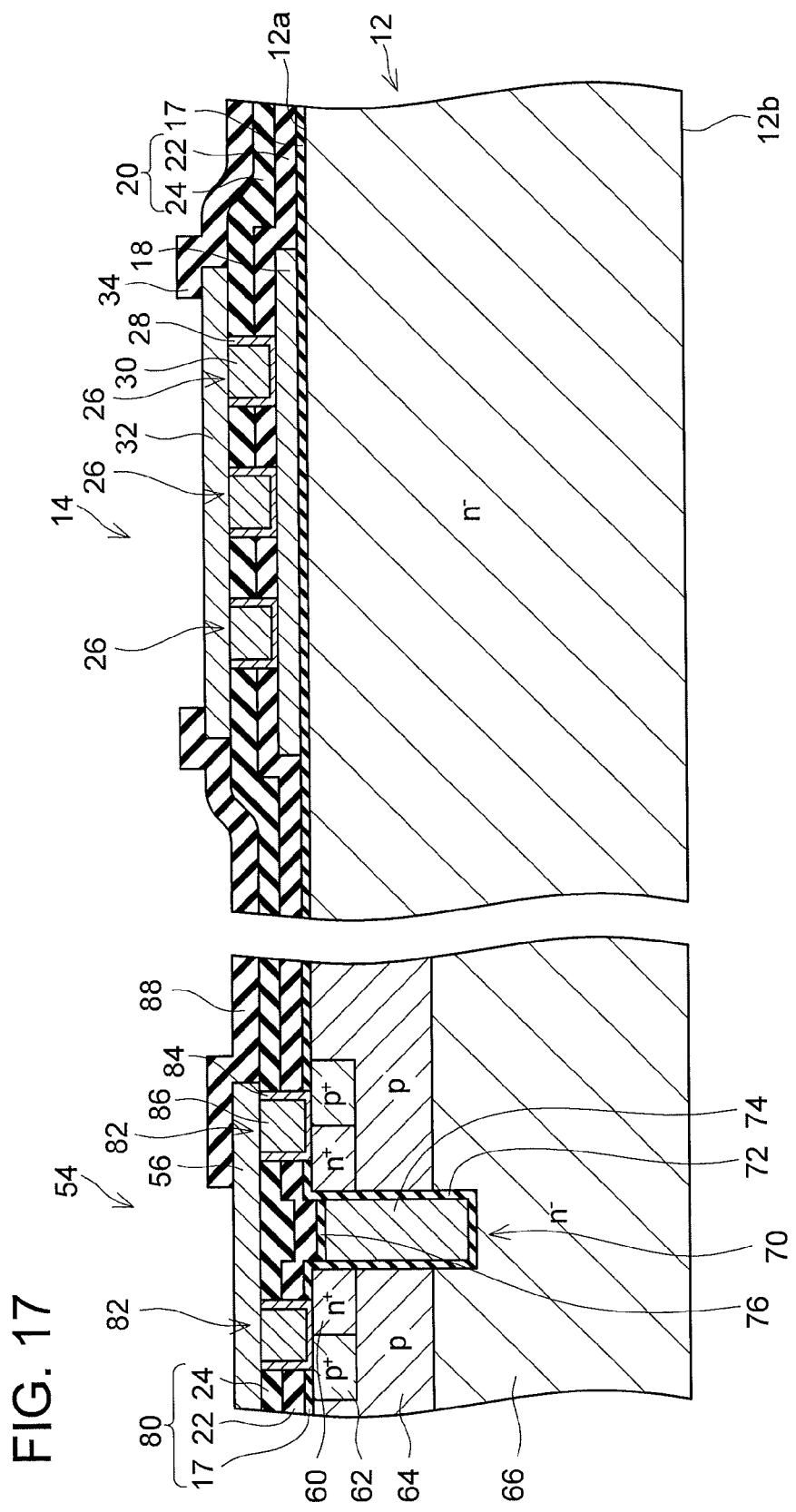
FIG. 17 is an explanatory view for the manufacturing process for the semiconductor device 10.

Next, as shown in FIG. 17, protective films 34, 88 are formed on a surface of the BPSG film 24, as shown in FIG. 17. The protective film 34 is formed so as to cover ends of the surface electrode 32. A portion of the surface electrode 32, which portion is not covered with the protective film 34, serves as a bonding pad 16. Additionally, a polyimide film 88 is formed so as to cover ends of the emitter electrode 56.

Subsequently, the semiconductor device 10 on a lower surface 12b side is processed to form a collector region 68 and a collector electrode 58. Thus, the semiconductor device 10 is completed.

When mounting the semiconductor device 10, the collector electrode 58 is connected to an electrode (not shown) by solder. Additionally, the emitter electrode 56 is connected to an electrode (not shown) by solder. Additionally, a wire 36 is connected to the bonding pad 16. The other end of the wire 36 is connected to an electrode (not shown). When the wire 36 is bonded to the bonding pad 16, the surface electrode 32 is pulled upwards strongly. However, as described above, in the semiconductor device 10, the surface electrode 32 is connected to the BPSG film 24 highly strongly. Thus, peeling off of the surface electrode 32 is prevented. Due to this, by removing the barrier metal, which has poor adhesion to the BPSG film 24, from the surface of the BPSG film 24 and then forming the surface electrode 32 on the surface of the BPSG film 24, the peeling of the surface electrode 32 can be prevented. Accordingly, occurrence of failure during the mounting of the semiconductor device 10 can be prevented.

Incidentally, in order to prevent the peeling of the surface electrode 32, it may be intended that the BPSG film 24 not be disposed under the bonding pad 16 such that an entire area under the bonding pad 16 is used as a contact hole. However, in a power semiconductor like the semiconductor device 10, an area with a diameter of at least about 150 μm is generally required as the bonding pad 16. Therefore, in a case where a contact hole is formed in the entire area under the bonding pad 16, the diameter of the contact hole has to be 150 μm or more. If the diameter of the contact hole is increased as described, a contact plug (i.e., tungsten) cannot be embedded in the contact hole. For obtaining a film thickness practically necessary for the development of tungsten, the diameter of the contact hole must be 1 μm or less. Therefore, in the semiconductor device 10 in Embodiment 1, the plurality of contact holes 26 with a small diameter is provided under the bonding pad 16. Employing such a structure allows the presence of the BPSG film 24 under the bonding pad 16. Even in such a structure, peeling of the surface electrode 32 can be prevented by bringing the BPSG film 24 and surface electrode 32 into direct contact with each other as described above.

Additionally, in Embodiment 1, the surface of the BPSG film 24 is flattened. Accordingly, the surface electrode 32 and emitter electrode 56 to be formed on the BPSG film 24 can be formed flat. If recesses and projections are included in the surfaces of the electrodes 32, 56, the electrodes 32, 56 are liable to crack due to repeated application of heat to the electrodes 32, 56 during use of the semiconductor device 10. If a crack reaches the semiconductor substrate 12, characteristics of the semiconductor device 10 will degrade. In contrast, the flat surfaces of the electrodes 32, 56 as in Embodiment 1 make cracks unlikely to occur and also unlikely to extend toward the semiconductor substrate 12 side (i.e., in the direction of thickness). Accordingly, the characteristics of the semiconductor device 10 in Embodiment 1 are unlikely to degrade.

Embodiment 2

Figure 18:
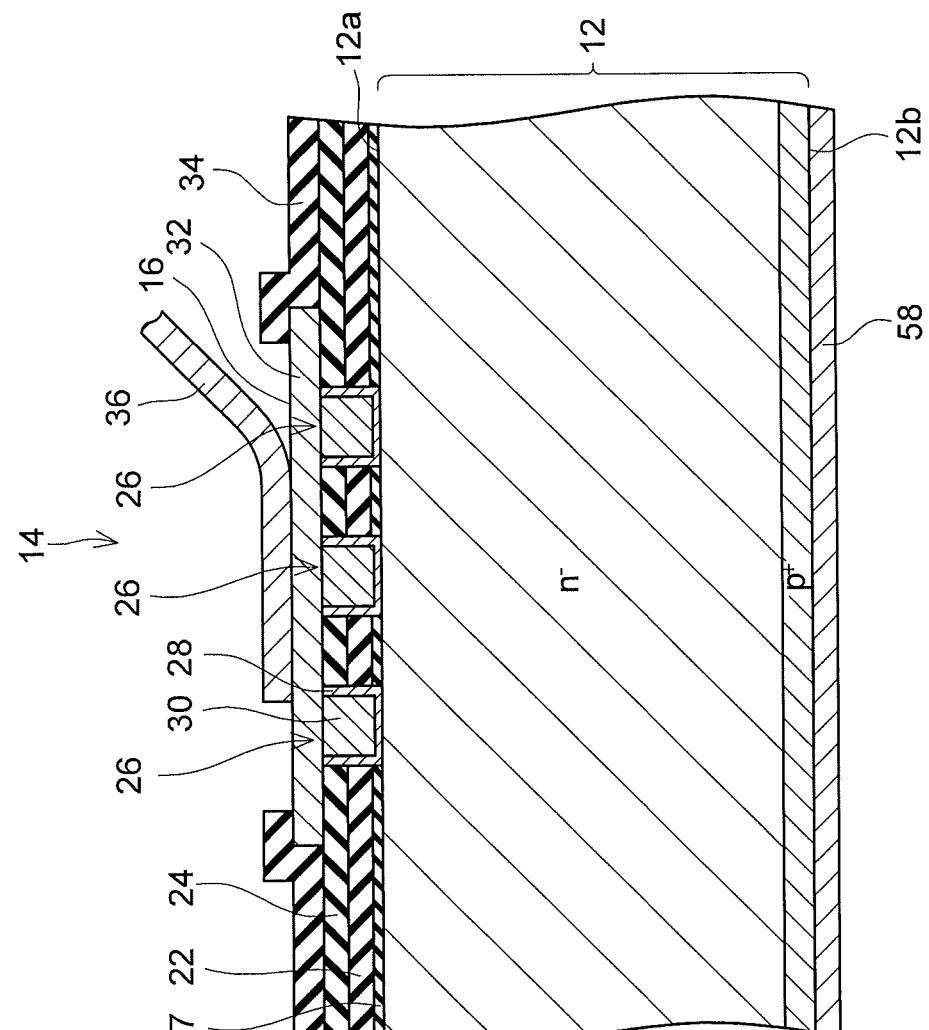
FIG. 18 is a vertical sectional view of a pad part 14 of a semiconductor device in Embodiment 2.

In Embodiment 1 described above, the surface electrode 32 comprising the bonding pad 16 is connected to the gate wiring 18 via the contact plug 30. Alternatively, as shown in FIG. 18, a surface electrode 32 may be connected to a semiconductor substrate 12 via contact plugs 30. That is, a conductive layer in the claims may be a gate wiring and/or semiconductor substrate. Alternatively, the conductive layer may be a wiring other than the gate wiring.

Additionally, in Embodiment 1 described above, the emitter electrode 56 is connected to the external electrode by solder. However, an emitter electrode 56 may be connected to an external electrode by a wire. That is, a bonding pad may be provided in the emitter electrode 56.

In the embodiment described above, as a barrier metal, the laminate structure of the TiSi layer, Ti layer, and TiN layer is employed. Alternatively, the barrier metal may be configured of a laminate structure of a TiSi layer and TiN layer. Additionally, the barrier metal contains a metal layer (e.g., TiN, TaN, or the like) that prevents an element of a contact plug above the barrier metal from diffusing into under the barrier metal. Additionally, it is preferable for a barrier metal to contain a metal layer (e.g., TiSi, CoSi, NiSi) that is in contact at low resistance with an electrode under this barrier metal.

Additionally, in the embodiment described above, tungsten is used as a contact plug. However, various conductive materials that are able to fill a contact hole can be used as a material for the contact plug. For example, W, Cu or the like can be employed as a contact plug.

Additionally, in the embodiment described above, AlSi is used as a surface electrode. However, various conductive materials that allow wire bonding can be employed as a material for the surface electrode. For example, W, Cu or the like can be employed as a surface electrode. A material of the surface electrode may be the same as that of a contact plug.

The technical elements disclosed in the specification are listed below. Each technical element below is independently useful.

In the configuration disclosed herein as an example, a semiconductor device may comprise a second insulating film located on the surface electrode. The second insulating film may comprise an opening. The bonding pad may be exposed in the opening. The protective film 34 in the embodiment described above is an example of the second insulating film.

In the configuration disclosed herein as an example, a plurality of the contact holes may be provided under the bonding pad.

In the configuration disclosed herein as an example, the first insulating film may further comprise an NSG film located between the BPSG film and the conductive layer.

In the configuration disclosed herein as an example, a semiconductor device may further comprise a semiconductor substrate and a third insulating film located on the semiconductor substrate. The conductive layer may be located on the third insulating film and made of polysilicon. The surface oxide film 17 in the embodiment described above is an example of the third insulating film.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

What is claimed is:

1. A semiconductor device comprising:
   an electrically conductive layer having a conductive property;
   a first insulating film located on the conductive layer and comprising a contact hole reaching the conductive layer, at least a surface part of the first insulating film being a boron phosphorous silicon glass (BPSG) film;
   a barrier metal covering an inner surface of the contact hole;
   a contact electrode located in the contact hole and on the barrier metal;
   a surface electrode located on the BPSG film and the contact electrode;
   a semiconductor substrate; and
   a third insulating film located on the semiconductor substrate,
   wherein
   the barrier metal is not interposed between the BPSG film and the surface electrode so that the surface electrode is directly in contact with the BPSG film,
   at least a part of the surface electrode is a bonding pad, and
   the conductive layer is located on the third insulating film so that the conductive layer is directly in contact with the third insulating film and insulated from the semiconductor substrate by the third insulating film.

2. The semiconductor device of claim 1, further comprising a second insulating film located on the surface electrode and comprising an opening,
   wherein the bonding pad is exposed in the opening.

3. The semiconductor device of claim 1, wherein a plurality of the contact holes is provided under the bonding pad.

4. The semiconductor device of claim 1, wherein the first insulating film further comprises an Non-doped silicon glass (NSG) film located between the BPSG film and the conductive layer.

5. The semiconductor device of claim 1, wherein the conductive layer is made of polysilicon.

* * * * *